United States Patent [19]

Crewe

[11] Patent Number: 5,563,415
[45] Date of Patent: Oct. 8, 1996

[54] MAGNETIC LENS APPARATUS FOR A LOW-VOLTAGE HIGH-RESOLUTION ELECTRON MICROSCOPE

[75] Inventor: Albert V. Crewe, Palos Park, Ill.

[73] Assignee: Arch Development Corporation, Chicago, Ill.

[21] Appl. No.: 487,926

[22] Filed: Jun. 7, 1995

[51] Int. Cl.$^6$ ................................................. H01J 37/14
[52] U.S. Cl. .................................. 250/396 ML; 250/310
[58] Field of Search .................. 250/396 ML, 396 R, 250/398, 310, 311

[56] References Cited

U.S. PATENT DOCUMENTS

| | | | |
|---|---|---|---|
| 3,624,390 | 11/1971 | Watanabe | 250/370 |
| 3,870,891 | 3/1975 | Mulvey | 250/398 |
| 4,209,702 | 6/1980 | Shirai et al. | 250/396 ML |
| 4,315,152 | 2/1982 | Smith | 250/396 ML |
| 4,419,581 | 12/1983 | Nakagawa | 250/396 |
| 5,008,549 | 4/1991 | Crewe | 250/396 ML |
| 5,023,457 | 6/1991 | Yonezawa | 250/396 ML |
| 5,079,428 | 1/1992 | Da Lin et al. | 250/396 ML |
| 5,149,967 | 9/1992 | Otaka | 250/396 ML |
| 5,241,176 | 8/1993 | Yonezawa | 250/310 |

OTHER PUBLICATIONS

"New Equipment and Commercial Information," *Proceedings RMS*, 30(2):177, Jun. 1995.
Crewe, "Is There a Limit to the Resolving Power of the SEM?" *Proc. XIth Int. Cong. on Electron Microscopy, Kyoto*, 2105–2108, 1986.
Crewe, "Limits of Electron Probe Formation," *Journal of Microscopy*, 178(Pt 2):93–100, May 1995.
Crewe and Parker, "Correction of Third–Order Aberrations in the Scanning Electron Microscopy," *Optik* 46(2):183–194, Apr. 1976.
Hitachi, "S–4200, Hitachi Scanning Electron Microscope," 3–24. No dated.
Hitachi, "S–4500, Hitachi Scanning Electron Microscope," 1–16. No dated.
Jeol, "JSM–6320F; Semi–in–lens FE SEM." No dated.
Kanaya and Ono, "Interaction of Electron Beam with the Target in Scanning Electron Microscope," *Electron Beam Interactions With Solids*, 69–98. No dated.
Mulvey, "Unconventional Lens Design," *Topics in Current Physics*, 389–391, 1982.
Nagatani and Saito, "Instrumentation for Ultra High Resolution Scanning Electron Microscopy," *Proc. XIth Int. Cong. on Electron Microscopy, Kyoto*, 2101–2104, 1986.
Takasahima, "New Electron Optical Technologies in Low Voltage Scanning Electron Microscopy," *Joel News*, 31E(1):33–35, 1994.
Zeiss, "New–Technology Scanning Electron Microscope, DSM 982 Gemini," 2–16. No Dated.

*Primary Examiner*—Jack I. Berman
*Assistant Examiner*—Kiet T. Nguyen
*Attorney, Agent, or Firm*—Arnold, White & Durkee

[57] ABSTRACT

A lens apparatus in which a beam of charged particles of low accelerating voltage is brought to a focus by a magnetic field, the lens being situated behind the target position. The lens comprises an electrically-conducting coil arranged around the axis of the beam and a magnetic pole piece extending along the axis of the beam at least within the space surrounded by the coil. The lens apparatus comprises the sole focusing lens for high-resolution imaging in a low-voltage scanning electron microscope.

45 Claims, 4 Drawing Sheets

MAGNETIC LENS APPARATUS FOR A LOW-VOLTAGE HIGH-RESOLUTION ELECTRON MICROSCOPE

The United States government has certain rights in the present invention pursuant to Grant DEFG0286ER60437 from the United States Department of Energy.

BACKGROUND OF THE INVENTION

A. Field of the Invention

The present invention relates to a magnetic lens apparatus for focusing a beam of charged particles, in particular a beam of electrons having an accelerating voltage of between about 10 and about 3000 V for use in a low-voltage scanning electron microscope.

B. Description of the Invention

1. Electron Microscopy

The scanning electron microscope (SEM) is the instrument of choice for the investigation of irregular surfaces both in biology materials sciences and the semiconductor industry. The SEM forms an image by focusing an electron probe onto the surface of the specimen and the image contrast is formed using the secondary electrons or the high energy backscattered electrons which are generated at or near to the surface. Since the depth of focus may be quite large there is no penalty to be paid for deep indentations or sharp projections and as a result the SEM has been used very effectively for the study of such diverse specimens as the surface of cell membranes or semiconductor circuits.

The normal form of the SEM is an instrument which uses electrons of around 30 kV to form the probe. The reason for this choice of voltages is that it is in this range where the electron probe can take on dimensions of relevance to the investigations of these various specimens. Probes can be formed with dimensions of the order of about 0.5 nm, producing effective resolutions in the range of about 0.7 nm.

It should also be noted that these very high resolving powers have been obtained by inserting the specimen inside the magnetic field of the lens which forms the probe and for best operation the specimen is placed at the point of maximum magnetic field at the center of the lens. The maximum magnetic field which is attainable with conventional materials is about 2 or 2.5 T and it is this which limits the focal length which can be obtained with these lenses and in turn it is the focal length which determines the aberration coefficients of the lens.

2. Unsuitability of High-Voltage Electrons for Delicate Specimens

Unfortunately, there is a penalty to be paid for using high voltage electrons, particularly when biological or other fragile specimens are examined. Such electrons penetrate deeply into specimens of these types to a distance on the order of a micron or two and yet the secondary electrons which form the image are generated only within the top 2 nm or so of the specimen. The consequence of this is that although the probe is small and high resolution can be obtained, the majority of the electrons penetrate deeply into the specimen and cause substantial damage. In the case of biological materials this can cause significant mass loss and even collapse of the specimen. In the case of semiconductors it has the consequence that the area that is being investigated can no longer be used in a working circuit.

3. Limitations of Conventional Magnetic Lenses

Focusing a beam of charged particles, e.g., electrons, by causing it to pass axially through a magnetic field of symmetrical distribution produced by a current-carrying coil positioned around the beam is well known in the mechanical arts. The focusing of charged particle beams, and particularly electron beams, is of paramount importance in the illuminating systems of scanning- and transmission-type electron microscopes, and in electron probe X-ray microanalysis apparati.

In each of these apparati, and particularly in the case of scanning electron microscopes (SEMs) and micro-analysis devices, a critical aspect of the lens is its ability to focus the electron beam on a small target area. Such a requirement has demanded that the resolutions of SEM lenses be of the highest possible order, and that chromatic and spherical aberrations of the lens be of the lowest possible order.

Conventional magnetic lenses which are used in these forms of apparati are positioned about the path of the beam and may occupy a considerable distance along the beam. Such lenses so positioned can impose undesirable structural and design limitations on the apparatus in which they are used. One such example is illustrated in U.S. Pat. No. 4,419,581 to Nakagawa. While an improvement over earlier designs, the size, shape, and above-stage configuration of the lens apparatus made it unsuitable for analysis of large specimens such as semiconductor wafers or low-voltage analysis of biological specimens.

Subsequent improvements in electron optic lens systems have been marginal. For example, the magnetic condenser lens system described in U.S. Pat. No. 5,241,176 to Yonezawa while employing conical lenses and tapered pole pieces to reduce the distance between the objective lens and the sample, still was an above-stage lens, and the improvement in resolving power over conventional SEM lenses was only about 50%.

Another limitation of these prior art lenses, was that all were closely positioned around the electron beam so that a very powerful pumping system was required to maintain the desired vacuum conditions within the constricted passageways (Mulvey, 1975).

Magnetic lens systems have been described which have a conducting coil positioned behind the target position with respect to the beam of particles in order to overcome such mechanical difficulties. One such system was described in U.S. Pat. No. 3,870,891 issued to Mulvey. The configuration of the Mulvey lens provided an improvement over the conventional magnetic lens systems of contemporary SEMs, but has not been considered for high-resolution focusing of low-voltage particle beams.

4. Deficiencies in the Prior Art

A major limitation of conventional lenses is that they typically have two sets of pole pieces, one above the specimen and one below. The specimen must be placed in this confined space and therefore the separation between the two sets of pole pieces must be of the order of several millimeters. This mechanical limitation significantly restricts the focal length to something of the order of a millimeter or two.

In the conventional design of magnetic lenses it is impossible to achieve the focal length required for very high resolutions and the reason for that is a simple mechanical one. The specimen must be placed in the magnetic field and it must be held in some form of mechanical device which allows for translation and perhaps rotation and tilt of the specimen. These mechanical requirements place a restriction on the smallest dimensions which the lens could have and it is virtually impossible to reduce the size of these mechanical components any further. It is for these and other reasons that there currently is a need in the art for a lens apparatus capable of high-resolution focusing of a low-voltage beam of charged particles.

The creation of a lens apparatus providing substantial improvement in resolution while also being capable of high-resolution focusing of low-voltage particle beams would represent a breakthrough in magnetic lens technology and greatly advance the field of scanning electron microscopy, particularly in the analysis of biological and other delicate specimens such as semiconductor wafers and related computer devices for which low-voltage beam analyses are tantamount.

SUMMARY OF THE INVENTION

The present invention seeks to overcome these and other inherent limitations of the prior art by providing a lens apparatus capable of the high-resolution focusing of a beam of low-voltage charged particles. In one preferred embodiment, such a lens apparatus is employed in a low-voltage, high-resolution scanning electron microscope.

The present invention is a lens apparatus adapted for use in a device for focusing a beam of charged particles having an accelerating voltage of about 100 to about 10,000 V. The lens generally comprises a solid pole piece for focusing the beam of charged particles and an electrically-conducting coil positioned axially around the pole piece to energize the pole piece and produce a magnetic field. The pole piece and coil are positioned within a yoke of soft iron or cold roll steel, or other suitable material which has a high magnetic permeability.

The pole piece is preferably about 0.5 mm to about 4 mm in diameter, with 1 to 3 mm in diameter being more preferred and pole pieces of about 1 mm, 2 mm, or 3 mm being highly preferred. The pole piece may be fabricated of soft iron, holmium metal, or some other suitable material having a high magnetic permeability. The entire lens assembly is positioned below the specimen on the side opposite to the one on which the incident electron beam impinges.

The magnetic lens comprises an electrically-conducting wire coil arranged around the longest axis of a pole piece which is composed of a material having a high magnetic permeability which extends along said axis within the space surrounded by the coil. The term "electrically-conducting wire coil" includes a single coil or a plurality of coils electrically connected so that, when suitably energized, will produce the magnetic field required to focus the beam onto the target.

Preferably the coil is annular and the magnetic pole piece is of annular cross-section. The pole piece may lie partially or wholly within the space surrounded by the coil and in a preferred embodiment it extends the entire length of the coil and extends from the end of the coil. The cross-sectional area of the pole piece is preferably as large as the dimensions of the coil will allow. Optionally at least part of the pole piece extending from the end of the is conical or slightly rounded, or tapers in the direction of the source of charged particles.

The pole piece may be formed into a nose-piece configuration and project beyond the side of the wire coil facing the source of charged particles. It may be shaped symmetrically about the axis of the beam of charged particles to induce a magnetic field configuration required for focusing the beam of charged particles in a desired manner. Such a magnetic field configuration may for example demand a high localized flux density and it will be recognized by a person skilled in the art that care must be exercised to ensure that the magnetic material of the pole piece is not unnecessarily driven into saturation in such a situation. If it is found to be necessary, the pole piece may be tapered or stepped along its length to overcome problems of saturation. This may be required, for example, if the snout projects a considerable distance beyond the side of the coil facing the source of charged particles. The coil is fashioned of copper or other suitable wire and may be cooled by evaporation, radiation, or by water cooling.

In one embodiment, a holder may be fixedly mounted onto the end of the pole piece perpendicular to the longest axis of the pole piece for the purpose of serving as a specimen stage. Both the pole piece and the pole piece-specimen holder unit may be coated with a thin film of carbon or other suitable material to reduce background radiation caused by electrons impinging directly onto the specimen holder and/or pole piece.

The accelerating voltage of the beam of charged particles is preferably from about 100 to about 10,000 V, and more preferably from about 500 to about 5,000 V. In particular embodiments, the accelerating voltage of the electron beam is from about 1,000 to about 3,000 V, and from about 2,000 to about 2,500 V. Of course, the accelerating voltage may be any practical voltage within this range, e.g., 100 V, 200 V, 300 V, 400 V, 500 V, 600 V, 700 V, 800 V, 900 V, 910 V, 920 V, 930 V, 950 V, 975 V, etc., even up to an including voltages of 2,000 V; 3,000 V; 4,000 V; 5,000 V; 9,000 V; and the like.

The lens apparatus of the present invention may be used in a device to provide substantially the only means for focusing a beam of charged particles onto a target position between the source and the lens. The lens apparatus may be used to focus a beam of electrons, and is particularly useful in focusing a beam of electrons in an electron microscope. Preferably the device is a transmission or scanning electron microscope, and most preferably, the microscope is a scanning electron microscope.

In certain embodiments a device in accordance with the present invention may comprise two or more lens apparati. This plurality of lenses may be used to simultaneously image one or more specimens, or may be used to consecutively image one or more specimens. The lenses may be arranged in any given arrangement that is practical within the confines of the device employing the lenses, and owing to the small size of the lenses, multiple lens arrays having about 3, 4, 5, or more lenses are contemplated. A particular advantage of the present lens design is the ability to fabricate small columns. With this design, multiple columns and multiple probes may be combined into a single apparatus to examine multiple specimens simultaneously. One example where this multi-lens array finds particular use is in the examination of identical semiconductor devices on a single silicon wafer, or the analysis of multiple regions of a particular biological specimen either simultaneously or consecutively.

Another aspect of the present invention is a method of focusing a low-voltage beam of charged particles to a high degree of resolution. Preferably the degree of resolution is on the order of about 0.5 to about 2 nm. Preferably the accelerating voltage is between about 100 and about 10,000 V. The method generally involves providing a source of charged particles having an accelerating voltage of about 100 to about 10,000 V along a given axis, and focusing the beam with a magnetic field produced by the lens apparatus disclosed herein.

1. Single Pole Magnetic Lenses

The single pole lens configuration of the present invention acts like a magnetic dipole such that the electrons are proceeding along the axis of the dipole and focus near to one of the poles. This is a very similar situation to one of the very first investigations in electron optics which was the one by Stormer who investigated the trajectories of high energy particles emitted by the sun and incident upon the earth.

If one imagines a single magnetic pole placed below the specimen with the electrons directed along the axis towards the specimen, then by adjusting the strength of that pole the electrons may be focused onto the specimen. For low voltage electrons, the advantages of the single pole lens are much more clearly evident. When using low voltage electrons it is possible to use a very high field strength at that single pole and thereby achieve a very small focal length. Because of the fact that there is little or no magnetic material above the specimen that whole region is left open and is available for the insertion of scanning coils and electron detectors. Additionally there is sample space for the mechanical devices which hold and manipulate the specimen itself.

By achieving a very small focal length it is possible to achieve a very high resolution because, as pointed out above, the coefficient of chromatic aberration is very closely equal to the focal length and as a result it is possible to come very much closer to the theoretical limit shown in FIG. 4 (Crewe, 1995).

2. Need for Low-Voltage High-Resolution SEM

In the area of semiconductors, an important consideration is the constant reduction in size of circuit designs. As the size reduction of patterns progresses, there arises a need to check if each process of production has been carried out exactly. Routinely, the inspection of resist and etching patterns is carried out by SEM analysis. In fact, specialized SEMs have been designed specifically for that purpose (Takashima, 1994).

The lens apparatus of the present invention greatly facilitates construction of an SEM for the morphological observation of semiconductor wafers. The advantages offered by the present invention include 1) high resolution at low accelerating voltages, 2) capability of large angle tilting of the specimen stage, 3) increased limits of specimen size due to the compactness and stationary nature of the lens apparatus; 4) capability of multiple lens arrays for both imaging and positional calibration of semiconductor wafers, again owing to the small size of the lens apparatus; and 5) the ability to incorporate an SEM directly into a production line.

BRIEF DESCRIPTION OF THE DRAWINGS

The drawings form pan of the present specification and are included to further demonstrate certain aspects of the present invention. The invention may be better understood by reference to one or more of these drawings in combination with the detailed description of specific embodiments presented herein.

DESCRIPTION OF THE PREFERRED EMBODIMENTS

1. Advantages of Low-Voltage SEM

Figure 1A:
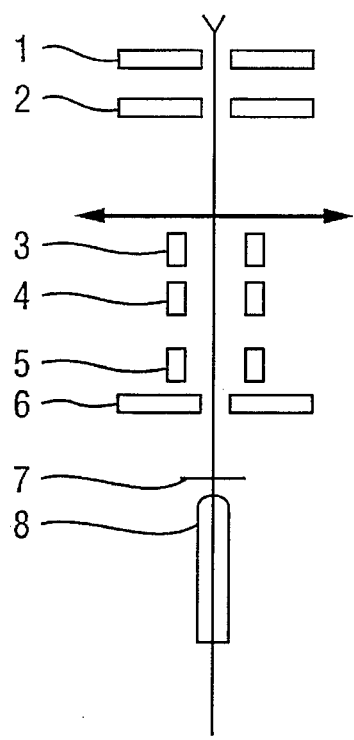
FIG. 1A illustrates a diagrammatic sectional view of a scanning electron microscope employing the lens apparatus of the present invention (FIG. 2) with a dual anode electron gun. Shown are the first anode 1, a second anode 2, the plane of the condenser lens (indicated by arrows), a stigmator 3, a first scanning coil 4, a second scanning coil 5, and annular detector 6, the specimen 7, and the lens apparatus of the present invention 8.

It is of considerable advantage in the analysis of biological and other delicate samples to use electrons which only penetrate to a depth of about 2 nm into the specimen because in that case the penetration would roughly match the depth from which secondary electrons can be generated. This would require electrons in the range of about a few hundred volts to about 2000 volts depending upon the atomic number of the material of the specimen (e.g., 3).

The unfortunate consequence of this is that the resolution of the SEM declines to a level that is no longer of interest to many investigators. It is not difficult to see the reason for this decline in resolution. The electrons which are generated by the source always have some spread in their energies and because of this spread of energies there is a corresponding axial spread of the focus of the electrons at the specimen. At high voltages this is not of serious consequences because the resolution is primarily determined by spherical, not chromatic, aberration.

However, as the voltage is reduced chromatic aberration becomes more and more important and finally becomes the dominant one. To be very specific at low voltages it is the chromatic aberration of the lens which can be thought of as the cause of the focus defect and the chromatic aberration of the magnetic lens is very closely equal to its focal length (Crewe, 1995). As a consequence of this the radius of the focused probe at the specimen is given by $$\delta = f\alpha \frac{\Delta V}{V}$$

where $\Delta V$ is the energy spread, V is the accelerating voltage, f is the focal length, and $\alpha$ is the semi-angle of convergence of the electrons at the probe.

Additionally the effect of the diffraction of electrons at the aperture which forms the probe must be taken into account. The optimization of lens operation is governed by the equation representing the ultimate resolution:

$$\delta = \frac{(f\Delta V)^{1/2}}{V^{3/4}} \times 2.74 \times 10^{-5} \; (m)$$

Thus, it is clearly advantageous to use electrons with the smallest possible energy spread and that implies the use of a field emission source of which there are two kinds, the cold field emission source (CFE) with an energy spread of ±0.1 eV and the thermal field emission source (TFE) where the value is ±0.24 eV.

It is clear from this equation that if one takes an SEM which has been designed to operate at 30 kV with a maximum magnetic field of around 2 T and a resolution of about 0.7 nm (which is about the state of the prior art), and then lowers the operating voltage to about 1 kV the resolution would be only about 4 nm. In fact, this is precisely the value which is claimed by the best instrument on the market today (Zeiss).

2. Technical Limitations of a Low-Voltage SEM

Quite recently the present inventor has examined the ultimate size of the electron probe in such probe-forming instruments as the SEM (Crewe, 1995). In doing so, restriction was made to the use of conventional materials where the maximum magnetic field is around 2.5 T, and general assumptions were made about the form of the magnetic field generated in the lens.

The results obtained were insensitive to the assumptions of the shape of the field or the maximum magnetic field, and the calculations were made without regard to practical issues with a maximum assumed field strength of 2.5 T adjusted in a gaussian-shaped width to produce a focus at the point of maximum field.

It became apparent that the spherical aberration component dominates the resolution, except when the accelerating voltage is 200 volts or less. The results indicated that it should be possible to achieve a resolution better than 1 nm at 1 kV, which of course is dramatically improved over any lens apparatus in the prior art.

Figure 4:
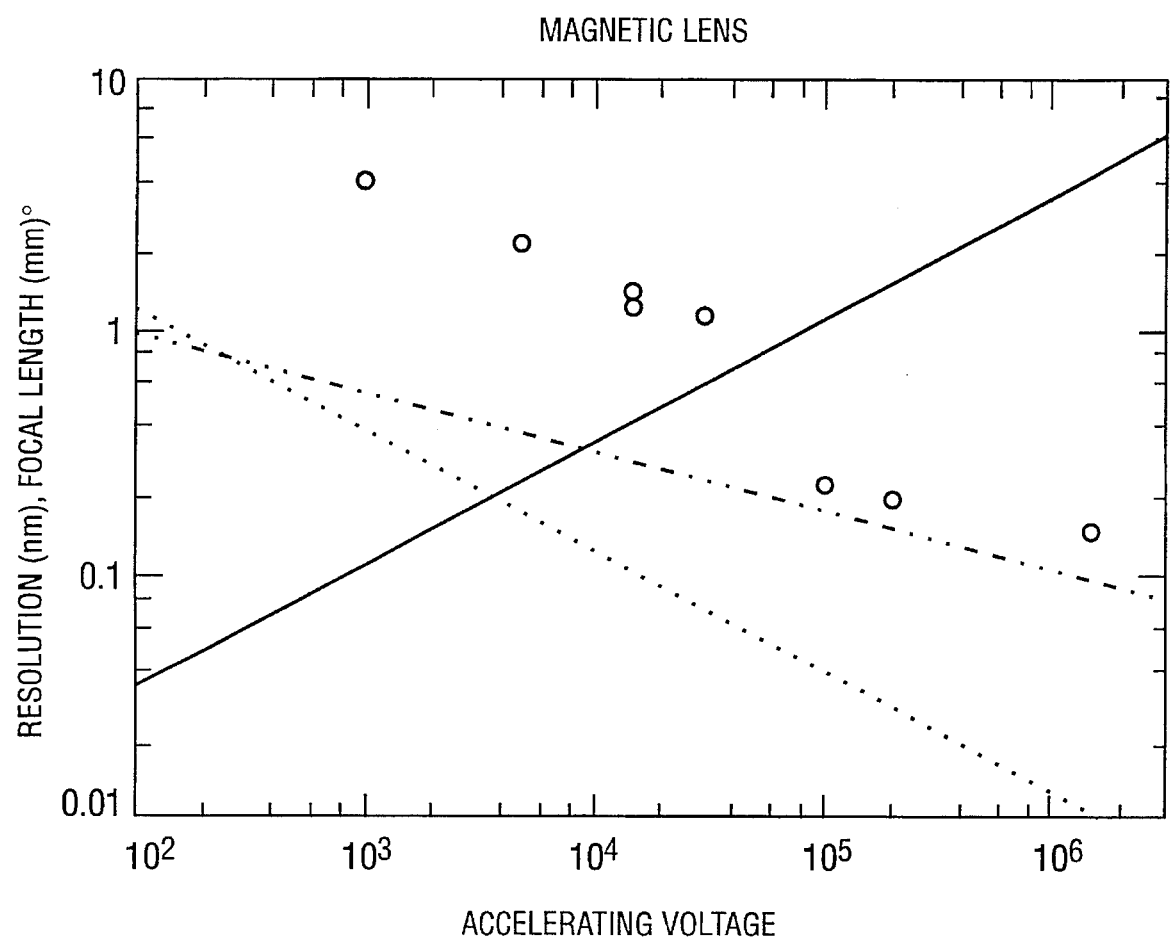
FIG. 4 illustrates the relationship between resolution and accelerating voltage as a function of lens focal length.
Figure 5:
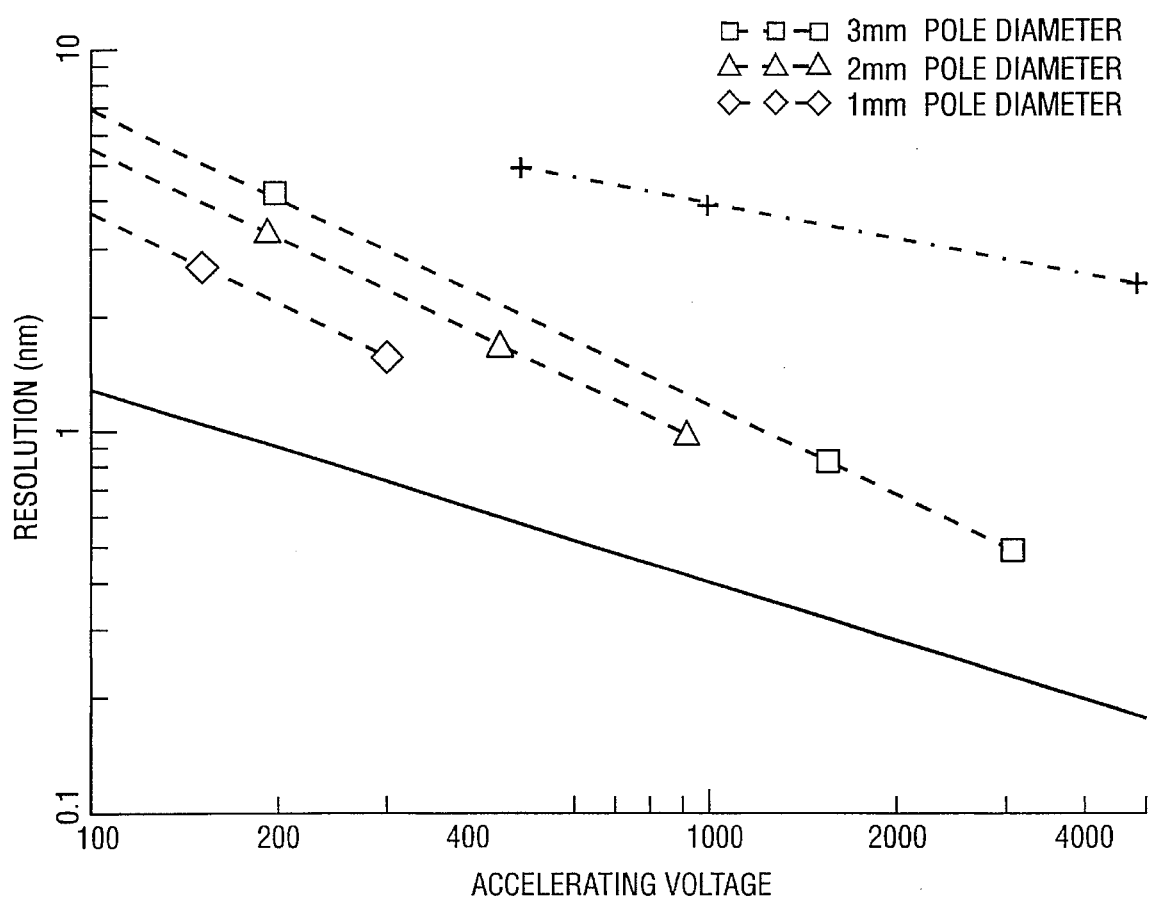
FIG. 5 illustrates the relationship between resolution and accelerating voltage as a function of the diameter of the pole piece of the present lens apparatus. The maximum theoretical value is given as the solid line. The dashed dotted line represents the highest resolutions obtained using the most superior lens system of the prior art.

It became clear from these calculations that in order to achieve such a resolution it is necessary that the lens have a very short focal length. In FIG. 4 the limits of resolution due to spherical aberration (dashed-dotted line) and chromatic aberration (dotted line) are shown for magnetic lenses operating at maximum magnetic field. The corresponding focal length is shown as a solid line. This line represents the resolution which is theoretically possible at various accelerating voltages together with the focal length which the lens would have in order to achieve that resolution. Superimposed on the curve are the resolution of several commercial instruments using data taken from manufacturer's specifications. From left to right, the commercial instruments are those of Hitachi, Zeiss, 2 available from JEOL, a microscope designed by the present inventor, Fisons, JEOL, and Berkeley Instruments.

At high voltages, the lens designs of the prior art perform very close to the theoretical limit; however, at low voltages these lenses perform three to four times worse than the theoretical limit due to the small focal lengths required at low voltages. These conventional lens designs do not permit such small focal lengths and are therefore unsuitable for low voltage high-resolution analyses.

In sharp contrast to the prior art, at low voltage ranges the present invention is clearly superior to the resolution of any instrument presently available owing to the very short focal length of the present lens apparatus.

3. Lens Apparatus Designed to Highly Resolve a Beam of Low-Voltage Charged Particles In order to achieve a condition where the magnetic field increases very rapidly near the focus at the specimen we need a field of the form $$B = B_0 \left( \frac{a}{z} \right)^n$$

where $B_0$ is the maximum field readily attainable (2.5 T) and a is the distance from the origin at which that field exists.

A coil is required to energize the lens and the number of ampere turns which are required may be calculated by integrating along the axis:

$$NI = \frac{10}{4\pi} \cdot \frac{B_0 a}{(n-1)} = 7,960 \frac{a}{(n-1)} \; A.T.$$

where a is in cm. When a=1 mm, $$NI = \frac{796}{(n-1)} \; A.T.$$

To consider the power requirements for the coil, examine a coil with an inner radius $r_1$, an outer radius $r_2$ and a height h. To define a shape parameter:

$$\eta = \frac{r_2 + r_1}{r_2 - r_1}$$

the power in the lens is closely approximated by $$W = \frac{\eta}{h} \; (NI)^2 + 10^{-5} \; \text{watts}$$

and for the case of a=1 mm, $$W = \frac{6.3\eta}{h(n-1)^2} \; \text{watts}$$

Thus, from the definition of $\eta$ that it is relatively easy to have $\eta \sim 1$. For example if $r_2 = 5$ mm, $\eta = 1.33$.

The final and most difficult task is to select a geometry for the iron which will define a particular value of n. By approximation, and based upon a number of attempts, values of n between about 2 and about 3 are contemplated.

For the case n=2, this corresponds to a single isolated magnetic pole which, of course, does not exist. However, a uniformly magnetized long needle is a close approximation, so a long iron rod may be energized by a solenoid wrapped around it. In that case h is taken to be large, perhaps 10 cm or so, and a slender coil, say $r_1 = 1$ mm, may be used. Thus, $r_2 = 2$ mm so that $\eta = 3$, and the power of the coil would be approximately 3 watts.

For n=3 (corresponding to a magnetic dipole), the field may be exemplified by a uniformly magnetized sphere. Ideally this would consist of an iron sphere with an infinitely thin coil wrapped around it but practically such may not be achieved, because the power would be too high. A more practical approximation would consist of an iron rod with a hemispherical end surrounded by an excitation coil and a magnetic yoke to return the flux. This configuration emulates a magnetic dipole.

Figure 2:
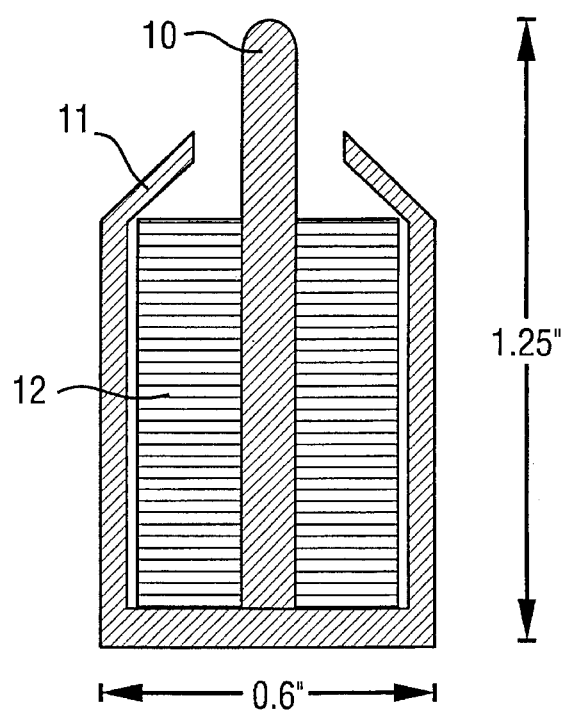
FIG. 2 illustrates in section along its axis one example of a magnetic lens incorporating a number of the preferred features of the invention shown in full-scale (approximately 1.25 inches by 0.6 inches). Identified are the pole piece 10, the yoke 11, and the energizing coil 12.

Taking all the various factors into account, a preferred embodiment of the lens apparatus of the present invention is illustrated schematically in FIG. 2. In this figure a pole piece 10 with a hemispherical end, surrounded by an energizing coil 12 projects through a return yoke 11 which is tapered at about a 45° angle to allow specimen tilt. The precise configuration of the pole piece and yoke may be altered depending upon the particular application of the lens apparatus, with alteration of the angle and design of the yoke possible.

The coil shown here is 2 cm long, so that for a=1 mm, $r_1$=1 mm, $r_2$=5 mm and then the power consumption would be less than 1 watt.

The lens has a layer of material of high magnetic permeability arranged around the side of the coil remote from the source of charged particles. This layer of magnetic material forms the yoke, and is preferably continuous within the periphery of the coil. The yoke is integral with or is in proximal contact with the cylindrical pole piece.

The yoke may also extend around the periphery of the coil and in some circumstances this peripheral magnetic layer may project beyond the side of the coil facing the source of charged particles. The yoke may extend to cover an outer portion, but not the whole, of the side of the coil facing the source of charged particles, and may be suitably shaped so as to modify the magnetic field distribution.

The electrically-conducting coil of the lens apparatus is preferably made as small as possible consistent with the satisfactory operation of the invention, and may conveniently be a winding of copper or other suitable wire. Alternatively, the coil may be fabricated such that the magnetic circuit is confined by a layer of magnetic material for the greater portion of its length. It is desirable that the magnetic field may be practically uninfluenced by the particular geometry chosen for the coil, and that the magnetic field strength along the axis of the lens depend primarily upon the number of turns of the coil winding and the extent of the electric current passing through the coil itself.

The electrically-conducting wire coil may be wound either with wire of any convenient cross-sectional shape or with thin metal strip. Anodized aluminum tape as described in U.S. Pat. No. 3,870,891 may conveniently be employed in this fashion.

In some applications, such as those comprising an electron microscope, the lens apparatus of the present invention is contained within a single or multiple vacuum chamber. In such applications, the magnetic lens is preferably constructed to have vacuum properties compatible with the conditions required within the chamber. This may conveniently be done by encapsulating the electrically conducting wire coil in a vacuum-tight enclosure, which enclosure may be formed by either a part or the whole of the combination of the aforementioned yoke and the magnetic polepiece together with a layer of non-magnetic material (for example brass or non-magnetic stainless steel) joined together with vacuum-tight seals to complete such an enclosure.

In an alternate embodiment, the lens apparatus may be located outside of the vacuum chamber behind the specimen position, thereby simplifying the construction of the magnetic lens which is no longer required to be compatible with the vacuum conditions existing within the chamber.

In a particular embodiment, the specimen holder or stage may be fixedly attached to the conical topmost end of the magnetic pole piece. In some situations, it may be desirable to cool the stage and/or specimen holder, and such may be accomplished either by ambient dissipation of heat, or by cooling the specimen/stage with a cooling fluid in a manner described herein for the cooling of the lens apparatus itself.

Referring to FIG. 2, a cylindrical magnetic pole piece 10, manufactured from e.g. soft iron or other magnetic material of high permeability, occupies the whole of the volume surrounded by the coil 12. The magnetic pole piece extends beyond the end of the yoke 11 and is symmetrical about the axis surrounded by the coil. In intimate contact with the end of the pole piece away from the specimen, the yoke is made of a layer of material of high magnetic permeability such as cold rolled steel which extends around the periphery of the coil. The lens is positioned to be coaxial with the beam of charged particles and can be suitably excited by energizing the coil to focus such a beam.

4. Components of the Low-Voltage SEM a. Electron Gun

A field emission source is preferred as the source of electrons because these sources have the lowest energy spread of any known electron source. This in itself is a major contribution towards being able to achieve a very small focused probe size. The electrons emitted by the source are generally emitted with an energy which is incompatible with the requirements of the microscope. For a cold field emission (CFE) source the energy emission may be generally on the order of about 3 to about 4 kV, whereas in a thermal field emission (TFE) source, the energy emission may be generally on the order of about 3 to about 8 kV.

Figure 1B:
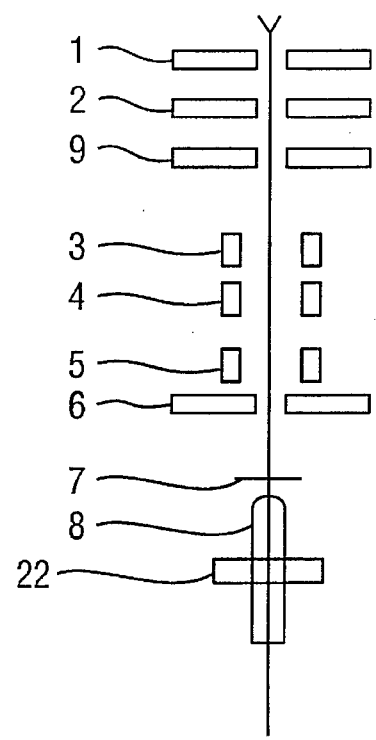
FIG. 1B illustrates a diagrammatic sectional view of a scanning electron microscope employing the lens apparatus of the present invention (FIG. 2) with a triple anode electron gun. Shown are the first anode 1, a second anode 2, a third anode 9, the plane of the condenser lens (indicated by arrows), a stigmator 3, a first scanning coil 4, a second scanning coil 5, and annular detector 6, the specimen 7, and the lens apparatus of the present invention 8.

This range of operating voltage is not under the immediate control of the designer or the operator of the instrument and as a consequence an electron gun is required which will change the energy of the electrons to that required by the operator. This may be achieved using a single-stage gun which uses only the source and two additional electrodes (anodes) (FIG. 1A), or alternatively, a preferred scheme is to use a two-stage gun with three electrodes (FIG. 1B).

The voltage between the source and the first electrode controls the emission current and as mentioned above, may be anywhere from about 3 to about 8 kV. The third electrode is the one that establishes the final energy of the electrons, and in a preferred embodiment, this final energy is generally on the order of about 10 to about 2000 V. The central electrode may be used to control the position of the image of the source formed by the electron gun, and such image may be formed either before or after the final single-pole lens.

In another embodiment, the present invention contemplates an alternative electron gun configuration, which employs a single-stage gun, that is to say one with only two electrodes, which could be followed by a very simple and rather weak magnetic lens which would serve the same function as the second focus electrode. In either case the function of the electron gun with or without the additional condenser lens is to produce an electron beam of a chosen energy and a chosen diameter in the plane of the specimen.

The voltages in the gun may be quite low by normal standards and therefore smaller insulators and smaller spacings may be employed. This in turn means that a gun may be used which is physically small, which is advantageous in many circumstance. For example the electron optical system will be less susceptible to external magnetic fields and also mechanical vibrations will be minimized. In preferred embodiments, either TFE or CFE sources may be employed, with TFE sources being particularly preferred owing to less stringent vacuum requirements for the TFE source. Electron sources providing a beam of electrons with an accelerating voltage of between about 10 and 10,000 V are preferred, with sources capable of producing accelerating voltages of between about 100 and 5,000 V being more preferred. Accelerating voltages of between about 3,000 V are particularly preferred.

b. Column

The specimen itself may be placed a small distance away from the electron gun, say a few centimeters, and in this space a series of scan coils is needed which would be used to deflect the electron beam in a raster fashion in order to scan the final focused probe across the specimen. In addition to the scan coils it is convenient to also insert a stigmator of conventional design which is used to correct the "out-of-roundness" of the electron beam. The specimen would be placed below the scan coils and immediately below the specimen would be the magnetic lens.

c. Lens

The lens apparatus of Example 1 is employed in the preferred embodiment of the low-voltage SEM. The pole piece of the lens may be made of iron, holmium, or other magnetic material, and is preferably on the order of about 1 to about 4 mm in diameter. More preferably the pole piece is about 2 or 3 mm in diameter. The pole piece may be tapered or angled at its uppermost end, and a specimen stage may be optionally attached perpendicularly to the longest axis of the pole piece at this uppermost end. Where desirable, a lens array system may be utilized in which a plurality of lenses are arranged for imaging multiple specimens simultaneously or consecutively, or for simultaneous or consecutive multiple images of a single specimen.

It is clear from the dimensions of the lens illustrated in FIG. 2 that a complete low-voltage microscope column could be very small in diameter, perhaps as small as about 1 cm. This makes it possible to arrange a number of columns in a close-packet array. Such an array may be useful to inspect semiconductor devices or other specimens such that many images could be obtained simultaneously or consecutively.

Heat may be dissipated from the lens apparatus either by evaporative cooling or by forced cooling of the lens by a circulating cooling solution such as water and the like. Alternatively, a solid finger-like extension or probe may be in proximity with the lens which is cooled by an outside source such as a conventional liquid nitrogen assembly. Such a configuration is particularly preferred when a pole piece of holmium is utilized rather than a conventional iron pole piece.

Alternatively, when it is desirable to produce a greater magnetic strength lens, the pole piece of the disclosed apparatus may be fabricated out of other suitable magnetic materials, e.g., i.e., holmium metal cooled to liquid nitrogen temperature. Such a pole piece may be expected to generate on the order of 4 T field strength vs. the conventional 2 to 3 T achieved using an iron pole piece.

The lens will preferably have a lower level of spherical aberration than those of conventional lenses, and provide an essentially-radial magnetic field to focus the charged particle beam.

d. Electron Detector

There are innumerable ways in which the electrons emerging from the specimen may be detected. These electrons, whatever their energy, will travel backwards along the magnetic field lines, that is to say towards the scan coils, but since many are generated at large angles of emission and since they have a different energy from the incident electrons it is possible to separate them. One method is to use an annular detector such that the incident electrons pass through the aperture. Alternatively, other electron detection mechanisms such as those commonly used in SEM practice may be utilized.

e. Specimen Handling

The design and fabrication of specimen stages is well known in the art, and any suitable stage may be utilized in conjunction with the present invention. One such stage is an X-Y stage obtained from Burleigh Instruments, Inc. (Fishers, N.Y.). This stage is an electrostriction device which only requires electrical connections to pass into the vacuum system. The stage may be mounted on a rotating arm so that the degree of specimen tilt can be adjusted. The specimen holder may then be fixed to the stage by means well known to those of skill in the art.

In one embodiment when it is desirable to have a tiltable stage, the specimen may not be at the point of maximum field strength, and hence field strength may be reduced slightly. Space may be allowed for a specimen tilt of up to and about 45°. For a pole of radius r, the specimen is at the point r√2 and consequently the field strength is reduced by a factor of 2√2 from that at the pole.

f. Vacuum System

The electron gun needs its own vacuum pump and a single ion pump of a few liters per second may be employed. Experience will indicate the precise pumping speed which is necessary but a pump as small as 8 l per second may be sufficient. A vacuum level of about $10^{-9}$ Torr would be preferred. Such vacuum systems are commercially available from Varian Vacuum Products, Fisons Vacuum Generators, ULVAC Technologies, and Physical Electronics, among others.

The specimen chamber may be quite small and uncluttered so that it is convenient to open up the whole chamber when changing specimens. A complete pumping station commercially available (e.g., Balzers, Inc.) is an example of one such preferred evacuation system. This station includes the roughing pump, a turb pump and complete instrumentation. The ultimate vacuum level may be on the order of about $10^{-7}$ Torr, although other suitable vacuum ranges may also be contemplated to be useful.

An important practical advantage of the invention is that the lens apparatus disclosed herein may be conveniently fitted into an electron beam apparatus so as to leave the whole space between the source of charged particles and the target position around the beam of charged particles available for placing large specimens, and/or a secondary electron detector or "light pipe".

g. Additional Features

If the specimen is very thin or if it has holes in it then it may be possible for some of the incident electrons to strike the pole piece and generate electrons. This may produce some background noise. However, because the incident electrons have such low energies penetration should be a rare occurrence but a thin coating of carbon or other suitable material on the iron pole piece will reduce the background by a large factor. Methods for coating carbon onto the pole piece are well known to those of skill in the art (e.g., by using a vacuum evaporator). It should be noted that the bare pole piece itself may serve as a specimen in its own right, which will be very useful for the purposes of column alignment and the like.

Regarding the field of view, particularly at low magnifications, concern arises because of the sharp radius of curvature of the pole piece. Electron optics suggest that other third order aberrations may become important, such as coma, astigmatism, distortion and curvature of field. Mechanisms for controlling such aberrations have been previously published (Crewe and Parker, 1976). At most this would involve some additional electronics. Dynamic stigmation presents no problem and distortion may be controlled in exactly the same way as it is done in TV sets, by adding nonlinear terms to the scan voltage. Curvature of field can be controlled by dynamically changing the virtual focus of the incident electron beam. For a fast scan this may be best accomplished by adjusting the middle electrode of a three-element electron gun. For slow scans it is also convenient to adjust the current in a condenser lens.

h. Cooling the Coil and Lens Apparatus

The size of the magnetic lens may be significantly reduced by comparison with conventional lenses by providing the coil with cooling means located, for example, within the layer of magnetic material or within the structure of the coil, thereby allowing a required magnetic field to be generated by a larger electric current flowing in a smaller number of turns of wire.

When desirable, the specimen stage and/or specimen holder may be cooled by ambient dissipation of heat energy, or alternatively by flowing a cooling solution around the specimen housing in a manner analogous to that of cooling the lens apparatus itself. Such a cooling fluid may be water, glycol, polyethylene glycol, liquid nitrogen, or other such suitable fluid. The use of a cooled specimen stage may be particularly desirable in the case of biological specimens.

5. Electron Optical Calculations

In order to estimate the performance of the system the existence of a magnetic field was assumed where the field strength depends upon $Z^n$ where Z is the distance along the axis from the dipole. Ray tracing calculations were then performed in such fields.

The field strength was normalized at a distance of z=1 cm and trajectories were then calculated from a source at z=10 cm, giving the position of the focus, the value of the field at that focus, the aberration coefficients and the magnification.

Considering the case where a=1 mm, in order to use this condition a focus at 1.4 mm or so is chosen to allow space for a specimen tilt. Further, at a value of z=1 mm the maximum magnetic field is 2.5 T. For n=3 this means a field value of 0.88 T at the focus and for n=2 the corresponding value is 1.25 T. Thus the maximum value of the electron energy and the various aberration coefficients may be specified for any particular value chosen:

For n=3 $V_{max}$=1200 v, $C_s$=-0.018 cm, $C_c$=0.038 cm, m=0.007.

For n=2 $V_{max}$=7600 v, $C_s$=0.033, $C_c$=0.074, m=0.015.

To calculate the resolution, it is important to consider the contribution of spherical aberration even when a TFE source is utilized. The dominant factors contributing to the resolution are spherical aberration and diffraction. Using the usual expression $$\delta = 0.43 C_s^{1/4} \lambda^{3/4}$$

and assuming an accelerating voltage of 1 kV in each case, a resolution of 0.8 nm for n=3 and 0.9 nm for n=2 is calculated.

Thus the present invention provides a resolution of 1 nm at 1,000 V, and importantly, the detailed shape of the lens element itself is not critical.

6. Low-Voltage High-Resolution SEM

Using the novel lens apparatus disclosed herein, a preferred embodiment of the present invention concerns the general description of a low-voltage SEM particularly useful in the analysis of biological and other fragile specimens. Schematic cross-sectional diagrammatic views of the components of either a two anode (FIG. 1A) or three anode (FIG. 1B) illustrate the preferred elements of the SEM described herein. A full-scale view of an SEM employing the lens apparatus of the present invention is shown in FIG. 3.

Figure 3:
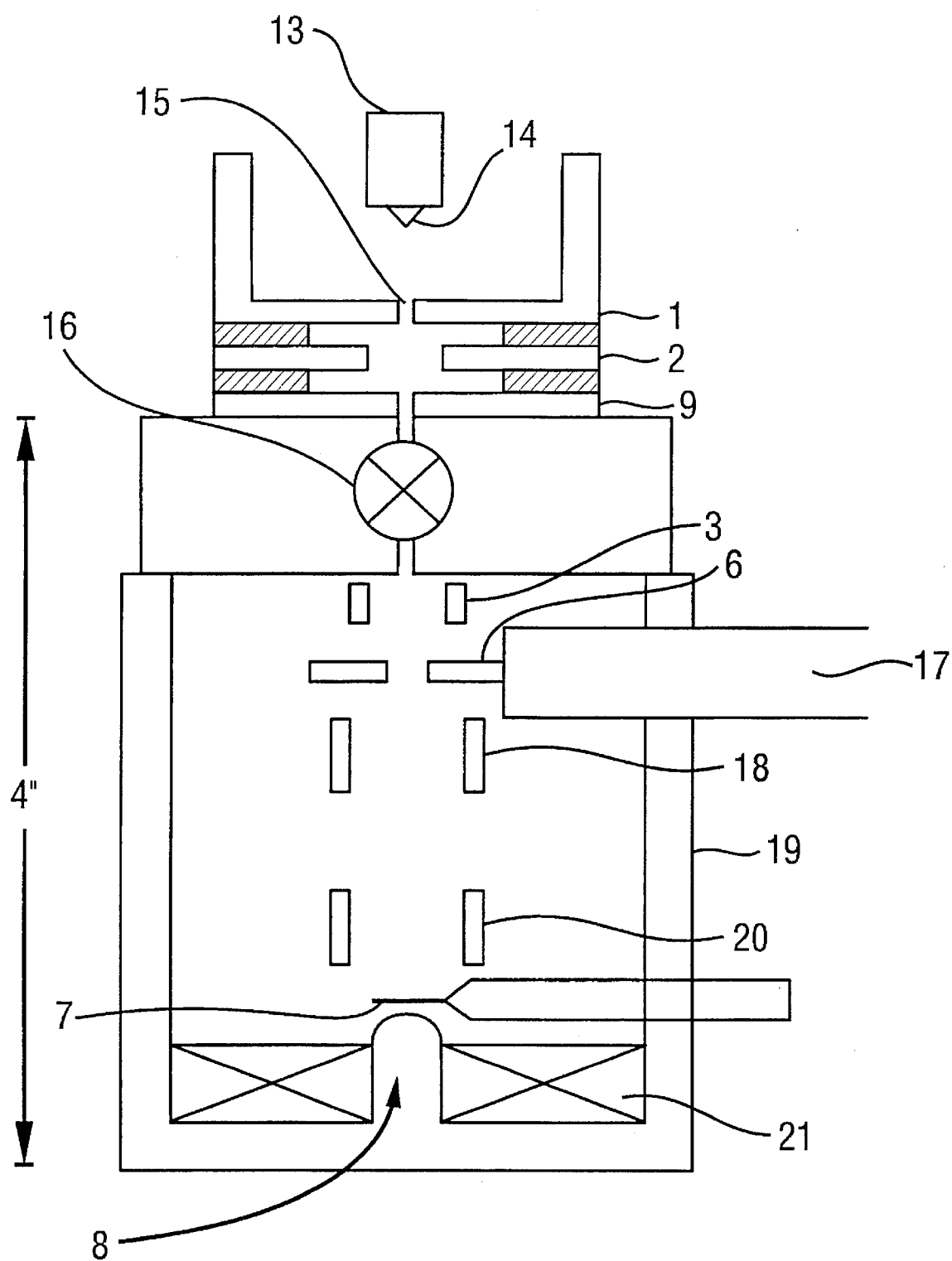
FIG. 3 illustrates in diagrammatic sectional view along its axis an example of a SEM apparatus employing the lens of the present invention to focus the beam of charged particles produced from the tip 14, of the field emission electron gun 13. Identified are the aperture 15, a first anode 1, a second anode 2, a third anode 9, the stigmator 3, the annular detector 6, a valve 16, the light pipe 17, a first deflector 18, the vacuum housing 19, a second detector 20, the specimen 7, the magnetic pole piece of the lens apparatus 8, and the energizing coil 21. The full-scale dimension shown is approximately 4 inches.

Referring to FIG. 3, a beam of electrons are produced from the tip 14 of a field emission source 13. Said beam passes through an aperture 15 and is accelerated by a first anode 1, a second anode 2, and optionally a third anode 9. A valve 16 isolates the vacuum of the gun from that of the rest of the column. Concentric with the axis of the beam produced, and in a plane normal thereto, is situated a stigmator 3, and first 18 and second 20 scanning deflector coils all of annular shape.

The single pole lens 8 projects from the coil 21, a short distance towards the source and causes the beam of electrons produced from the electron gun to be brought to focus at the target position 7 where the specimen is located. An X-ray detecting device 17 receives radiation reflected from the specimen onto the annular detector 6 which collects the secondary electrons produced by interaction of the beam with the specimen. The housing 19 contains the components of the system and preserves the integrity of the vacuum system; it may be made of iron or other suitable material.

While the description of the preferred embodiments of the present invention are disclosed herein, it should be appreciated by those of skill in the art that the techniques and apparati discovered by the inventor to function well in the practice of the invention can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

All of the apparati and methods disclosed and claimed herein can be made and executed without undue experimentation in light of the present disclosure. While the apparati and methods of this invention have been described in terms of preferred embodiments, it will be apparent to those of skill in the art that variations may be applied to the apparati, methods and in the steps or in the sequence of steps of the method described herein without departing from the concept, spirit and scope of the invention. More specifically, it will be apparent that certain components which are either chemically or structurally related may be substituted for the agents described herein while the same or similar results would be achieved. All such similar substitutes and modifications apparent to those skilled in the art are deemed to be within the spirit, scope and concept of the invention as defined by the appended claims.

REFERENCES

The references listed below and all references cited herein are incorporated herein by reference to the extent that they supplement, explain, provide a background for, or teach methodology, techniques, and/or compositions employed herein.

Crewe, A. V., "Is there a limit to the resolving power of the SEM?" *Proc. 11th Intl. Congr. Electr. Microscop.* 3:2105–2108. Kyoto, 1986.

Crewe, A. V., "Limits of electron probe formation," *J. Micro.* 178:93, 1995.

Crewe and Parker, "Correction of third order aberrations in the scanning electron microscope," *Optik:* 183–194, 1976.

Kanaya and Ono, "Interaction of Electron Beam with the Target in Scanning Electron Microscope," *In: Electron Beam Interactions with Solids*, p. 69–98, Chicago, Ill.

Mulvey, T. "Magnetic Lenses." U.S. Pat. No. 3,870,891, 1975.

Mulvey, "Unconventional Lens Design," *In: Magnetic Electron Lenses*, ed. P. W. Hawkes, p. 391. Springer-Verlag, Berlin, 1982.

Nagatani, T. and Saito, S., Instrumentation for ultra high resolution scanning electron microscopy. *Proc. 11th Intl. Congr. Electr. Microscop.* 3:2101–2104. Kyoto, 1986.

Nakagawa, S., "Magnetic Objective Lens for Use in a Scanning Electron Microscope," U.S. Pat. No. 4,419,581, 1983.

Takashima, S., "New Electron Optical Technologies in Low Voltage Scanning Electron Microscope," *JEOL News*, 31E(1):33–35, 1994.

Yonezawa, A., "Scanning Electron Beam Microscope with High Resolution at Low Accelerating Voltage," U.S. Pat. No. 5,241,176, 1993.

What is claimed is:

1. A lens apparatus adapted for use in a device for focusing a beam of charged particles, comprising:

(a) a solid pole piece for focusing a beam of charged particles having an accelerating voltage of about 100 to about 10,000 V; and (b) an electrically-conducting coil coiled around said pole piece for energizing said pole piece to produce a magnetic field, wherein said pole piece and coil are positioned within a yoke.

2. The apparatus of claim 1, wherein said pole piece is from about 0.5 mm to about 4 mm in diameter.

3. The apparatus of claim 2, wherein said pole piece is from about 1 mm to about 3 mm in diameter.

4. The apparatus of claim 3, wherein said pole piece is about 1 mm in diameter.

5. The apparatus of claim 3, wherein said pole piece is about 2 mm in diameter.

6. The apparatus of claim 3, wherein said pole piece is about 3 mm in diameter.

7. The apparatus of claim 1, wherein said pole piece comprises iron or holmium metal.

8. The apparatus of claim 1, wherein said coil further comprises a cooling device.

9. The apparatus of claim 1, wherein said coil further comprises a carbon film coating.

10. The apparatus of claim 1, wherein said beam of charged particles comprises electrons.

11. The apparatus of claim 1, wherein said charged particles have an accelerating voltage of about 500 to about 5,000 V.

12. The apparatus of claim 11, wherein said charged particles have an accelerating voltage of about 1,000 to about 3,000 V.

13. The apparatus of claim 12, wherein said charged particles have an accelerating voltage of about 1,500 to about 2,500 V.

14. The apparatus of claim 1, wherein said yoke is fabricated of iron or steel.

15. A device for focusing a beam of charged particles having an accelerating voltage of about 100 to about 10,000 V, comprising:

(a) a source operative to produce a beam of charged particles having an accelerating voltage of about 100 to about 10,000 V along a given axis; and (b) the lens apparatus of claim 1, said lens apparatus being operative to produce a field for focusing said beam.

16. The device of claim 15, further defined as an electron microscope.

17. The device of claim 16, further defined as a scanning electron microscope.

18. The device of claim 15, wherein said beam of charged particles comprises electrons.

19. The device of claim 15, wherein said accelerating voltage is about 500 to about 5,000 V.

20. The device of claim 19, wherein said accelerating voltage is about 1,000 to about 3,000 V.

21. The device of claim 20, wherein said accelerating voltage is about 1,500 to about 2,500 V.

22. A method for focusing a beam of charged particles having an accelerating voltage of between about 100 and about 10,000 V, said method comprising:

(a) providing a source of charged particles having an accelerating voltage of about 100 to about 10,000 V along a given axis; and (b) focusing said beam with a magnetic field produced by a lens apparatus comprising a solid pole piece for focusing a beam of charged particles having an accelerating voltage of about 100 to about 10,000 V; and an electrically-conducting coil coiled around said pole piece for energizing said pole piece to produce a magnetic field, wherein aid pole piece and coil are positioned within a yoke.

23. The method of claim 22, wherein said accelerating voltage is about 500 to about 5,000 V.

24. The method of claim 23, wherein said accelerating voltage is about 1,000 to about 3,000 V.

25. The method of claim 24, wherein said accelerating voltage is about 1,500 to about 2,500 V.

26. The method of claim 22, wherein said beam of charged particles comprises electrons.

27. The method of claim 22, wherein said magnetic field is from about 2 to about 4 Tesla.

28. The method of claim 22, further comprising cooling of said lens apparatus by a cooling device.

29. The method of claim 28, wherein said cooling device is a liquid nitrogen probe or water-cooled jacket.

30. A lens apparatus adapted for use in a device for focusing a beam of charged particles, comprising:

(a) a solid pole piece for focusing a beam of charged particles having an accelerating voltage of from about 100 to about 10,000 V; and (b) an electrically-conducting coil coiled around said pole piece for energizing said pole piece to produce a magnetic field, wherein said pole piece and coil are positioned within a yoke, said magnetic field sufficient for resolving said beam of charged particles to a resolution less than about 4 mm at an accelerating voltage of about 1000 V.

31. The apparatus of claim 30, wherein said resolution is of from about 4 mm to about 4 nm at an accelerating voltage of about 1000 V.

32. The apparatus of claim 30, wherein said resolution is of from about 4 nm to about 2 nm at an accelerating voltage of about 1000 V.

33. The apparatus of claim 30, wherein said resolution is of from about 2 nm to about 1 nm at an accelerating voltage of about 1000 V.

34. The apparatus of claim 30, wherein said resolution is of from about 1 nm to about 0.5 nm at an accelerating voltage of about 1000 V.

35. A device for focusing a beam of charged particles having an accelerating voltage of from about 100 to about 10,000 V, comprising:

(a) a source operative to produce a beam of charged particles having an accelerating voltage of from about 100 to about 10,000 V along a given axis; and (b) the lens apparatus of claim 30, said lens being operative to produce a field for focusing said beam.

36. The device of claim 35, further defined as an electron microscope.

37. The device of claim 36, further defined as a scanning electron microscope.

38. An electron beam device for focusing a beam of charged particles having an accelerating voltage of from about 100 to about 10,000 V, comprising:
   (a) an electron beam source operative to produce a beam of electrons having an accelerating voltage of from about 100 to about 10,000 V along a given axis; and
   (b) the lens apparatus of claim 1 or claim 36, said lens being operative to produce a field for focusing said beam of electrons onto a target position on the axis between said source and said lens apparatus, said lens apparatus being positioned on the side of said target position opposite to said source.

39. The electron beam device of claim 38, wherein said lens apparatus is capable of producing a field strength of from about 2 to about 4 Tesla.

40. An electron microscope comprising the lens apparatus of claim 1 or claim 30.

41. The electron microscope of claim 40, wherein said microscope is a scanning electron microscope.

42. A lens apparatus adapted for use in a device for focusing a beam of charged particles, comprising:
   (a) a solid pole piece for focusing a beam of charged particles having an accelerating voltage of from about 100 to about 10,000 V, said pole piece capable of producing a field strength of from about 2 to about 4 Tesla; and
   (b) an electrically-conducting coil coiled around said pole piece for energizing said pole piece to produce a magnetic field, wherein said pole piece and coil are positioned within a yoke, said magnetic field sufficient for resolving said beam charged particles to a resolution less than about 4 mm at an accelerating voltage of about 1000 V.

43. The apparatus of claim 42, wherein said resolution is of from about 4 mm to about 4 nm at an accelerating voltage of about 1000 V.

44. The apparatus of claim 42, wherein said resolution is of from about 4 nm to about 1 nm at an accelerating voltage of about 1000 V.

45. The apparatus of claim 42, wherein said resolution is of from about 1 nm to about 0.5 nm at an accelerating voltage of about 1000 V.

* * * * *

UNITED STATES PATENT AND TRADEMARK OFFICE
CERTIFICATE OF CORRECTION

PATENT NO.: 5,563,415
DATED: October 8, 1996
INVENTOR(S): Albert V. Crewe

It is certified that error appears in the above-identified patent and that said Letters Patent is hereby corrected as shown below:

In claim 22, column 16, line 17, delete "aid" and insert --said-- therefor.

In claim 38, column 17, line 9, delete "claim 36" and insert --claim 30-- therefor.

In claim 42, column 18, line 10, after "said beam " insert --of--.

Signed and Sealed this

Twenty-fifth Day of February, 1997

Attest:

BRUCE LEHMAN

Attesting Officer

Commissioner of Patents and Trademarks